United States Patent
Tateishi

(10) Patent No.: US 8,187,718 B2
(45) Date of Patent: May 29, 2012

(54) BARRIER LAMINATE, BARRIER FILM SUBSTRATE AND DEVICE

(75) Inventor: Tomomi Tateishi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 490 days.

(21) Appl. No.: 12/422,433

(22) Filed: Apr. 13, 2009

(65) Prior Publication Data

US 2009/0258235 A1    Oct. 15, 2009

(30) Foreign Application Priority Data

Apr. 14, 2008   (JP) .................. 2008-104517

(51) Int. Cl.
- *B32B 27/32* (2006.01)
- *B32B 27/30* (2006.01)
- *C08F 20/10* (2006.01)
- *C08F 120/10* (2006.01)
- *C08F 220/10* (2006.01)

(52) U.S. Cl. ........ 428/522; 428/521; 428/523; 428/698; 428/702; 526/323.2

(58) Field of Classification Search ........................ None
See application file for complete search history.

(56) References Cited

U.S. PATENT DOCUMENTS

| | | | |
|---|---|---|---|
| 7,901,767 B2 * | 3/2011 | Tsukahara et al. | 428/336 |
| 2009/0015781 A1 * | 1/2009 | Shimodaira et al. | 349/158 |

FOREIGN PATENT DOCUMENTS

| | | |
|---|---|---|
| EP | 1842873 A1 * | 10/2007 |
| EP | 2050780 A2 | 4/2009 |
| JP | 8-165368 A | 6/1996 |
| JP | 2007-38445 A | 2/2007 |
| WO | WO 2005040256 A1 * | 5/2005 |

OTHER PUBLICATIONS

Machine translation of JP 08-165368 (Jun. 1996).*
Machine translation of JP 2007-038445 (Feb. 2007).*

* cited by examiner

*Primary Examiner* — Alicia Chevalier
*Assistant Examiner* — Scott R Walshon
(74) *Attorney, Agent, or Firm* — Birch, Stewart, Kolasch & Birch, LLP

(57) ABSTRACT

Disclosed is a barrier laminate comprising at least one organic layer and at least one inorganic layer, wherein the organic layer is obtained by curing a polymerizable composition comprising 1 to 50% by weight of a polymerizable compound which has a bisphenol skeleton and having an aliphatic group.

12 Claims, No Drawings

BARRIER LAMINATE, BARRIER FILM SUBSTRATE AND DEVICE

FIELD OF THE INVENTION

The present invention relates to a barrier laminate, a barrier film substrate and a device.

DESCRIPTION OF THE RELATED ART

Heretofore, a barrier film substrate comprising an organic layer and an inorganic layer has been studied. This is because an alternate layer structure of the inorganic layer and the organic layer improves the barrier properties. As such a barrier film laminate, JP-A-8-165368 discloses a barrier film substrate in which the organic layer comprising a bisphenol A type epoxyacrylate having a particular structure is provided on the inorganic layer. JP-A-2007-38445 discloses a barrier film-substrate which comprises at least one organic layer and at least one ceramic layer, wherein the organic layer is obtained by curing a photo curable composition showing non-flowability at 25° C. and showing flowability at 50 to 100° C.

However, in recent years, higher barrier property tends to be required.

SUMMARY OF THE INVENTION

The object of present invention is to solve the above problem, and is to provide a barrier film substrate having higher barrier property.

Given the situation as above, the present inventor has assiduously studied and has found that the above problem can be solved by the following measures.

(1) A barrier laminate comprising at least one organic layer and at least one inorganic layer, wherein the organic layer is obtained by curing a polymerizable composition comprising 1 to 50% by weight of a polymerizable compound, the polymerizable compound having a bisphenol skeleton and having an aliphatic group.

(2) The barrier laminate according to (1), wherein the polymerizable compound is at least one selected from monofunctional (meth)acrylates and monofunctional epoxy (meth)acrylates.

(3) The barrier laminate according to (1), wherein the polymerizable compound is represented by the following formula (A):

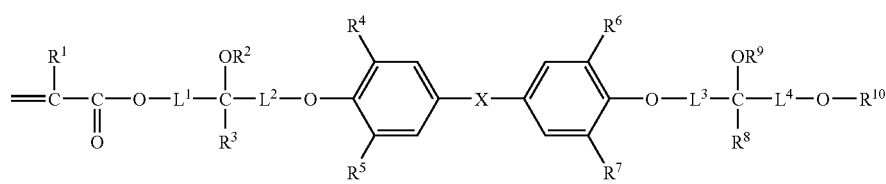

formula (A)

wherein X is a single bond or a divalent linking group, $L^1$, $L^2$, $L^3$ and $L^4$ each independently represent a divalent linking group, $R^1$, $R^2$, $R^3$, $R^4$, $R^5$, $R^6$, $R^7$, $R^8$, $R^9$ and $R^{10}$ each independently represent a hydrogen atom, a substituted or unsubstituted alkyl group, or a substituted or unsubstituted aryl group, and at least one of $R^1$, $R^2$, $R^3$, $R^4$, $R^5$, $R^6$, $R^7$, $R^8$, $R^9$ and $R^{10}$ is a substituted or unsubstituted alkyl group.

(4) The barrier laminate according to any one of (1) to (3), wherein the polymerizable composition comprises 50 to 99% by weight of a polyfunctional monomer.

(5) The barrier laminate according to any one of (1) to (3), wherein the polymerizable composition comprises 50 to 99% by weight of a polyfunctional monomer having a bisphenol skeleton.

(6) The barrier laminate according to any one of (1) to (3), wherein the polymerizable composition comprises 50 to 90% by weight of the total amount of a compound represented by the following formula (B) and/or a compound represented the following formula (E):

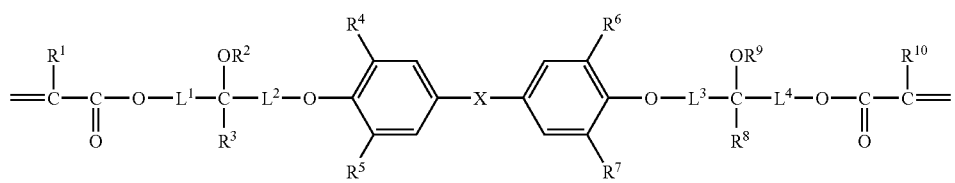

formula (B)

wherein X is a single bond or a divalent linking group, $L^1$, $L^2$, $L^3$ and $L^4$ each independently represent a divalent linking group, and $R^1$, $R^2$, $R^3$, $R^4$, $R^5$, $R^6$, $R^7$, $R^8$, $R^9$ and $R^{10}$ each independently represent a hydrogen atom, a substituted or unsubstituted alkyl group, or a substituted or unsubstituted aryl group;

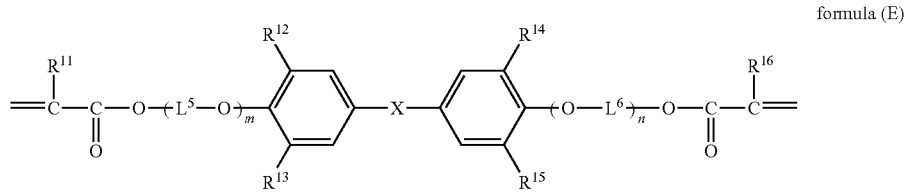

formula (E)

wherein X is a single bond or a divalent linking group, $L^5$ and $L^6$ each independently represent a divalent linking group, $R^{11}$, $R^{12}$, $R^{13}$, $R^{14}$, $R^{15}$, and $R^{16}$ each independently represent a hydrogen atom, a substituted or unsubstituted alkyl group, or a substituted or unsubstituted aryl group, and m and n each independently are an integer of 0 to 12.

(7) The barrier laminate according to (6), wherein the polymerizable compound comprises at least one compound represented by the formula (B) as the compound represented by the formula (B) and/or the compound represented by the formula (E).

(8) The barrier laminate according to (6), wherein the polymerizable compound comprises at least one compound represented by the formula (E) as the compound represented by the formula (B) and/or the compound represented by the formula (E).

(9) The barrier laminate according to any one of (1) to (3), wherein the polymerizable composition comprises 50 to 99% by weight of a compound represented by the following formula (B):

(12) The barrier laminate according to any one of (1) to (11), which has an alternate layer structure of the organic layer and the inorganic layer.

(13) The barrier laminate according to any one of (1) to (11), which has an alternate layer structure of the organic layer and the inorganic layer, and comprises at least two of the inorganic layers.

(14) The barrier laminate according to any one of (1) to (10), wherein the inorganic layer comprises a metal oxide, a metal nitride, a metal carbide, a metal oxide-nitride, or a metal oxide-carbide.

(15) A barrier film substrate produced by providing the barrier laminate of any one of (1) to (14) on a substrate film.

(16) A device comprising the barrier film substrate according to (15) as a substrate.

(17) A device sealed up with the barrier laminate according to any one of (1) to (14).

(18) A device sealed up with the barrier film substrate according to (15).

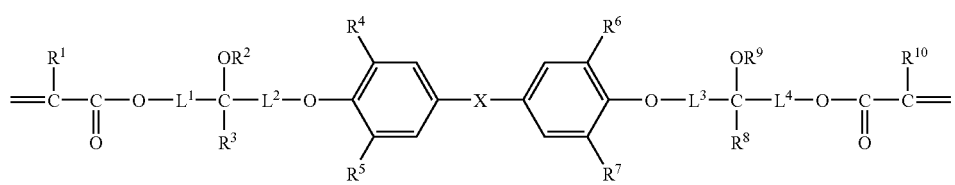

formula (B)

wherein X is a single bond or a divalent linking group, $L^1$, $L^2$, $L^3$ and $L^4$ each independently represent a divalent linking group, and $R^1$, $R^2$, $R^3$, $R^4$, $R^5$, $R^6$, $R^7$, $R^8$, $R^9$ and $R^{10}$ each independently represent a hydrogen atom, a substituted or unsubstituted alkyl group, or a substituted or unsubstituted aryl group.

(10) The barrier laminate according to any one of (1) to (9), which further comprises at least one (meth)acrylate monomer having a phosphoester group.

(11) The barrier laminate according to any one of (1) to (9), wherein the polymerizable composition further comprises at least one compound represented by the following formula (P):

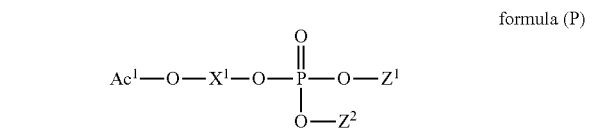

formula (P)

wherein $Z^1$ represents $Ac^2$—O—$X^2$—, an substituent group not having a polymerizable group, or a hydrogen atom, $Z^2$ represents $Ac^3$—O—$X^3$—, an substituent group not having a polymerizable group, or a hydrogen atom, $Ac^1$, $Ac^2$ and $Ac^3$ each independently represent an acryloyl group or a methacryloyl group, and $X^1$, $X^2$ and $X^3$ each independently represent an alkylene group, an alkyleneoxy group, an alkyleneoxycarbonyl group, or an alkylenecarbonyloxy group, or a combination thereof.

(19) The device according to any one of (16), (17) and (18), which is an electronic device.

(20) The device according to any one of (16), (17) and (18), which is an organic EL device.

The present invention makes possible to provide the barrier film substrate having improved barrier property.

DESCRIPTION OF SPECIFIC EMBODIMENTS

The contents of the present invention are described in detail hereinunder. In this description, the numerical range expressed by the wording "a number to another number" means the range that falls between the former number indicating the lowermost limit of the range and the latter number indicating the uppermost limit thereof. "Organic EL device" as referred to herein means an organic electroluminescent device. In addition, "(meth)acrylate" means acrylate and methacrylate in the present specification.

(Barrier Laminate)

The barrier laminate of the present invention comprises at least one organic layer and at least one inorganic layer, wherein the organic layer is obtained by curing a polymerizable composition comprising 1 to 50% by weight of a polymerizable compound, which compound has a bisphenol skeleton and has an aliphatic group. By employing the barrier laminate having such an organic layer, barrier property of the barrier laminate is enhanced. The barrier laminate of the present invention preferably has an alternate layer structure, in which at least two organic layers and at least two inorganic layers are laminated alternately.

(Organic Layer)

The organic layer in the present invention is obtained by curing a polymerizable composition comprising 1 to 50% by weight of a polymerizable compound, which compound has a bisphenol skeleton and has an aliphatic group.

(Polymerizable Compound)

The polymerizable compound used in the present invention has a bisphenol skeleton and an aliphatic group. Examples of the bisphenol skeleton include bisphenol A(BPA), bisphenol S, bisphenol P and bisphenol F, and preferred are bisphenol A and bisphenol S. The polymerizable compound used in the present invention is more preferably a compound selected from monofunctional (meth) acrylate and monofunctional epoxy (meth) acrylate, still more preferably a compound represented by the formula (A).

and the alkyl group and the aryl group may incorporate an ether bond therein. Further still more preferable is 10 carbon atoms.

$R^3$, $R^4$, $R^5$, $R^6$, $R^7$ and $R^8$ each are preferably a hydrogen atom or a linear or branched alkylene group having not more than 20 carbon atoms, more preferably that having not more than 10 carbon atoms.

$R^{10}$ is preferably a linear or branched alkyl group, an aryl group, an alkylcarbonyl group or an arylcarbonyl group, which groups have not more than 20 carbon atoms, and the alkyl group and the aryl group may incorporate an ether bond therein. Further still more preferable is not more than 10 carbon atoms.

The polymerizable composition contains 1 to 50% by weight of the polymerizable compound, more preferably 1 to

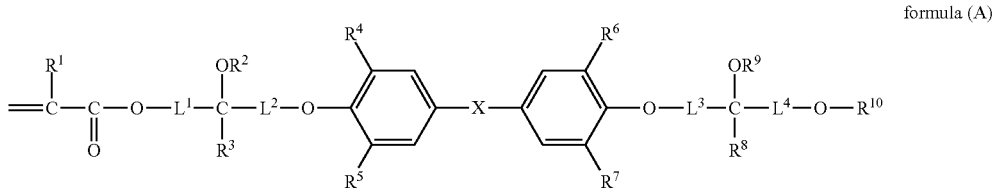

formula (A)

wherein X is a single bond or a divalent linking group, $L^1$, $L^2$, $L^3$ and $L^4$ are each represent a divalent linking group, $R^1$, $R^2$ $R^3$, $R^4$, $R^5$, $R^6$, $R^7$, $R^8$, $R^9$ and $R^{10}$ each represent a hydrogen atom, a substituted or unsubstituted alkyl group, or a substituted or unsubstituted aryl group, and at least one of $R^1$, $R^2$, $R^3$, $R^4$, $R^5$, $R^6$, $R^7$, $R^8$, $R^9$ and $R^{10}$ is a substituted or unsubstituted alkyl group.

X is preferably a divalent linking group, more preferably an alkylene group, an arylene group, an ether group, a thioether group, a carbonyl group and a sulfonyl group, and a combination thereof, still more preferably an alkylene group. These groups may have a substituent group, and these groups or the substituent groups of there groups may bond each other to form a ring. The carbon atoms of the alkylene group is preferably 1 to 20, more preferably 1 to 10, still more preferably 1 to 5. By setting the number of carbon atoms to such a range, the viscosity of the polymerizable composition does not rise too much higher than needed, and the purification and the 40% by weight, still more preferably 1 to 30% by weight. By setting to such a range, even when the curing is not enough, failure (bleed out) caused by bleeding based on heat transfer of the uncuring is prevented from occurring. Two or more polymerizable compounds may be contained.

(Polyfunctional Monomer)

The polymerizable composition in the present invention preferably comprises a polyfunctional monomer, more preferably a polyfunctional monomer having a bisphenol skeleton, still more preferably a compound represented by the formula (B) and/or a compound represented by the formula (E). Further more preferably, the polymerizable composition comprises at least one compound represented by the formula (B). The inclusion of the polyfunctional monomer contributes to improvement of the productivity with enhancement of the curing speed.

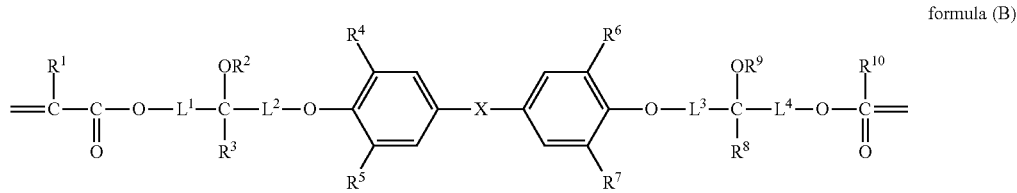

formula (B)

handling becomes easier to carry out. $L^1$, $L^2$, $L^3$ and $L^4$ are each preferably a linear or branched alkylene group having not more than 20, and an ether bond may be incorporated therein. Further, the carbon atoms is preferably 1 to 10.

$R^1$ is preferably a hydrogen atom or a methyl group.

$R^2$ and $R^9$ each are preferably a hydrogen atom, an alkylcarbonyl group having not more than 20 carbon atoms, or an arylcarbonyl group having not more than 20 carbon atoms, wherein X is a single bond or a divalent linking group, $L^1$, $L^2$, $L^3$ and $L^4$ are each represent a divalent linking group, and $R^1$, $R^2$, $R^3$, $R^4$, $R^5$, $R^6$, $R^7$, $R^8$, $R^9$ and $R^{10}$ each represent a hydrogen atom, a substituted or unsubstituted alkyl group, or a substituted or unsubstituted aryl group.

The preferred range of X, $L^1$, $L^2$, $L^3$, $L^4$, $R^1$, $R^2$, $R^3$, $R^4$, $R^5$, $R^6$, $R^7$, $R^8$ and $R^9$ is the same as that in the above formula (A), respectively.

The preferred range of $R^{10}$ is the same as that of $R^1$ in the above formula (A).

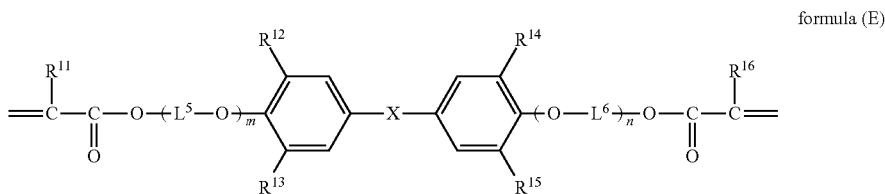

formula (E)

wherein X is a single bond or a divalent linking group, $L^5$ and $L^6$ each independently represent a divalent linking group, $R^{11}$, $R^{12}$, $R^{13}$, $R^{14}$, $R^{15}$, and $R^{16}$ each independently represent a hydrogen atom, a substituted or unsubstituted alkyl group, or a substituted or unsubstituted aryl group, and m and n each independently are an integer of 0 to 12.

The preferred range of X is the same as that of X in the above formula (A).

$L^5$ and $L^6$ are each preferably a linear or branched alkylene group having not more than 20, and an ether bond may be incorporated therein.

$R^{11}$ and $R^{16}$ are each preferably a hydrogen atom or a methyl group.

The preferred range of $R^{12}$, $R^{13}$, $R^{14}$, and $R^{15}$ is the same as that of $R^4$, $R^5$, $R^6$, and $R^7$ in the above formula (A), respectively.

The polyfunctional monomer having a bisphenol skeleton, such as the compounds represented by the formula (B) or (E), may be synthesized by reacting a bisphenol derivative having a hydroxyl group with (meth)acrylate chloride. Examples of the bisphenol derivative having a hydroxyl group include ethylene oxide modified bisphenols, which may be synthesized by reacting bisphenols with an ethylene oxide.

The polyfunctional monomer having a bisphenol skeleton, such as the compounds represented by the formula (B) or (E), also may be synthesized by reacting a bisphenol derivative having an epoxy group with a (meth)acrylate. The bisphenol derivative having an epoxy group, for example, may be synthesized by reacting bisphenols with an epichlorhydrin.

The monofunctional acrylate monomer having a bisphenol skeleton represented by the formula (A) may be synthesized by introducing a (meth)acryloyl group in the same manner as the formula (B), and then substituting the remaining hydroxyl group or epoxy group.

The compound represented by the formula (E) is preferably used together with the compound represented by the formula (B).

Compounds other than the above compounds exemplified below.

As acrylate series compounds, exemplified are polyfunctional radiation curable acrylate series compounds having two or more functional group such as acrylates, urethanacrylates, polyesteracrylates and epoxyacrylates, and preferred are ethyleneglycoldi (meth) acrylate, propyleneglycoldi (meth) acrylate, butyleneglycoldi (meth) acrylate, neopentylglycoldi (meth) acrylate, hexanedioldi (meth) acrylate, trimethylolethanetri (meth) acrylate, trimethylolpropantri (meth) acrylate, pentaerythritoltri (meth) acrylate, pentaerythritol tetra (meth) acrylate, pentaerythritolpenta (meth) acrylate, dipentaerythritolhexa (meth) acrylate, glyceryltri (meth) acrylate, triallyl (meth) acrylate, bisphenol A ethyleneoxide modified di (meth) acrylate and the like.

As styrene series compounds, preferred are polyfunctional radiation curable styrene series compounds having two or more functional group such as styrene, α-methylstyrene, 4-methylstyrene and the like.

Examples of the acrylate series compounds shown below, to which, however, these are not limited in the present invention.

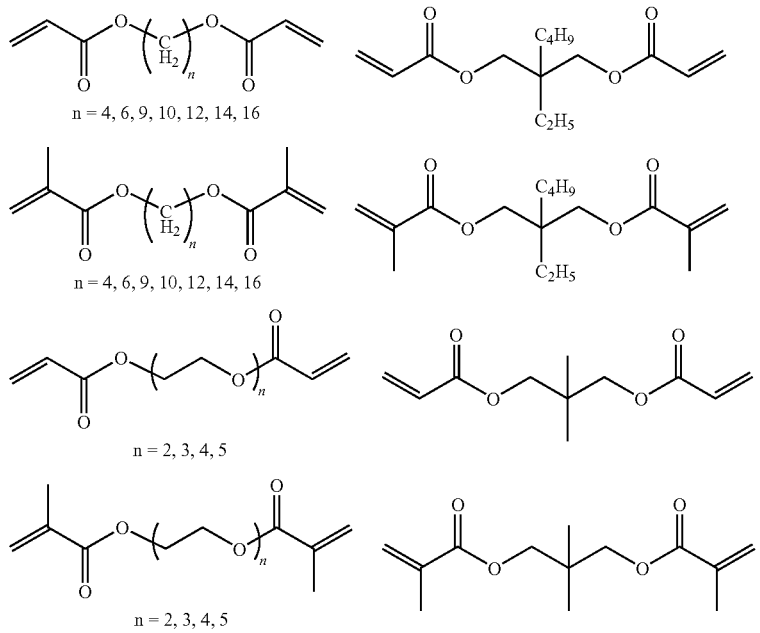

-continued
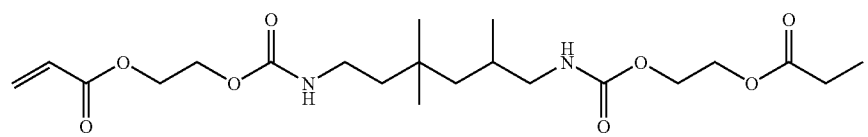
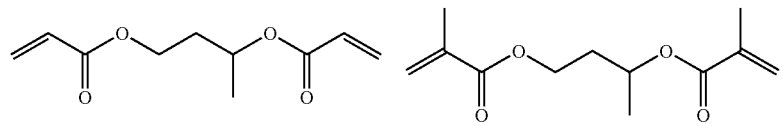
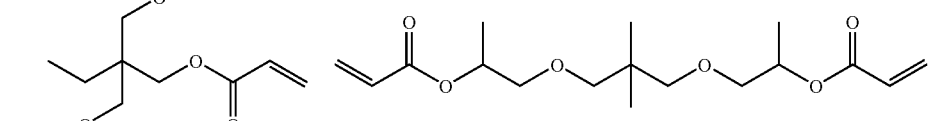
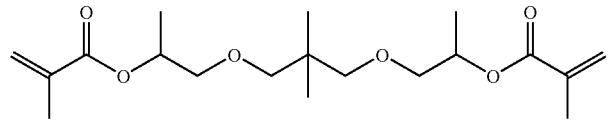
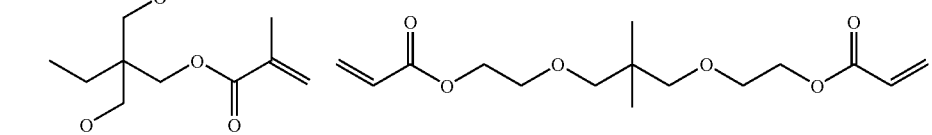
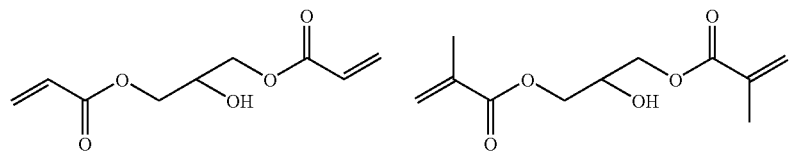
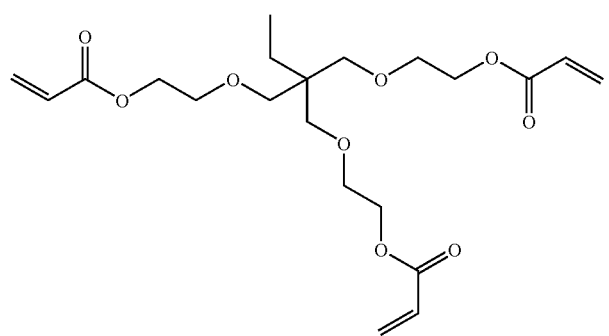

11
-continued
12
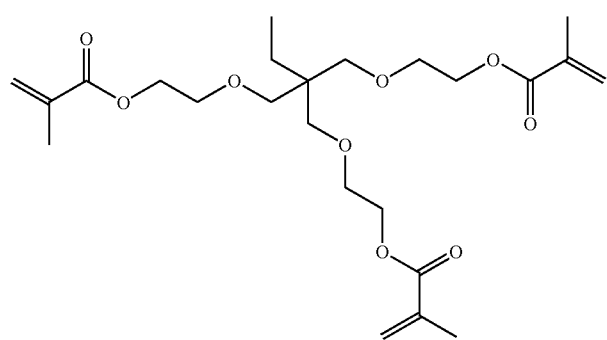
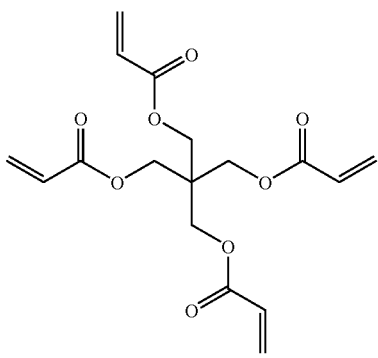
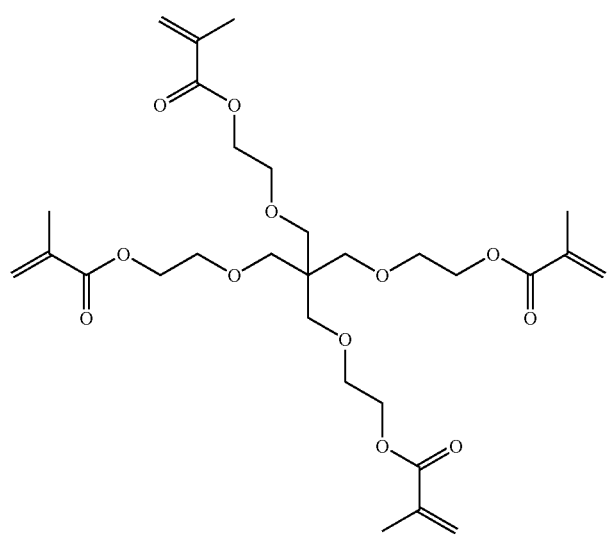
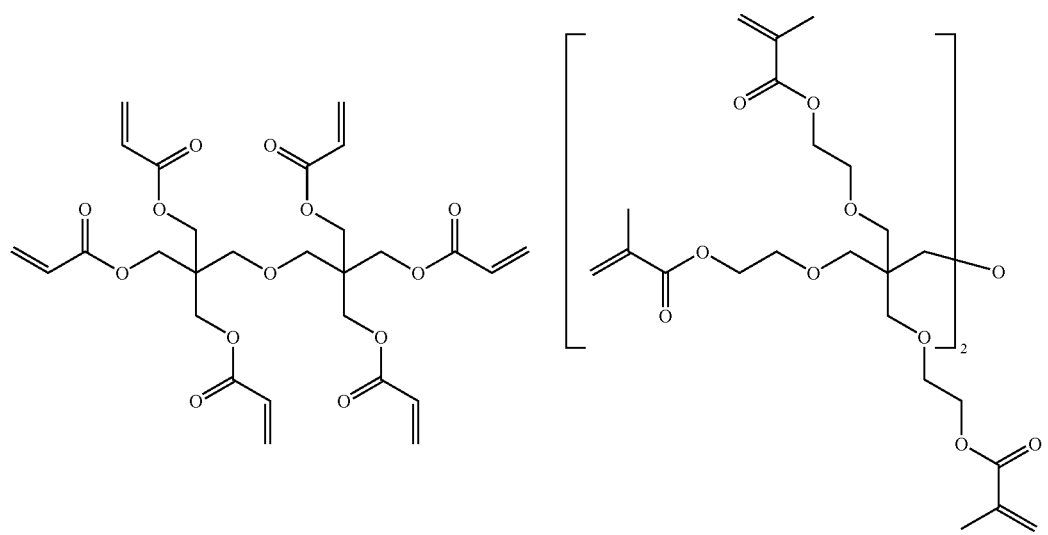

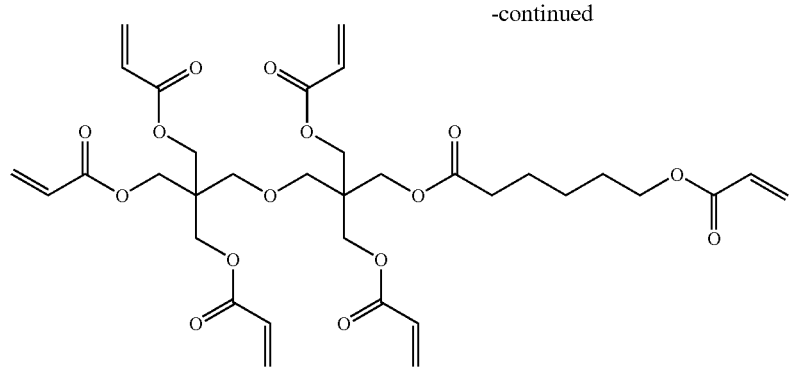
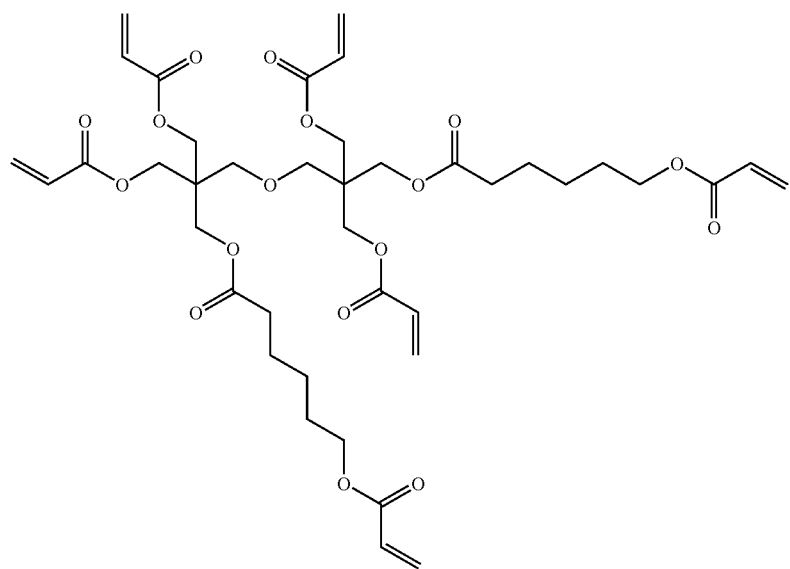
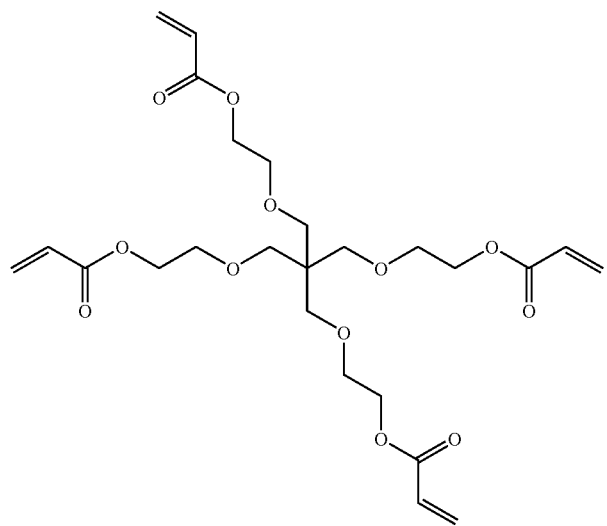

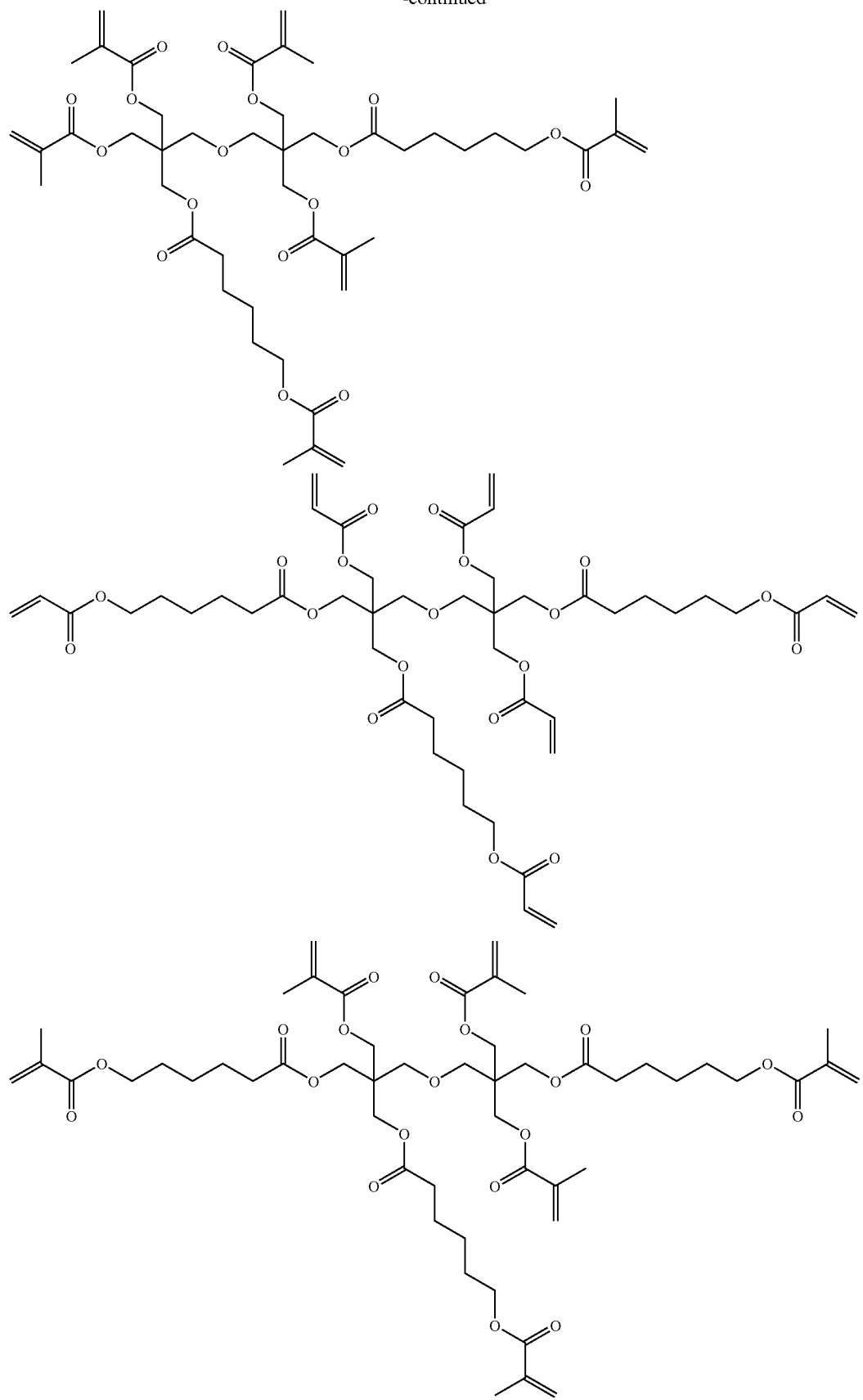

In the polymerizable composition in the present invention, the amount of the polyfunctional monomer is 50 to 90% by weight, preferably 60 to 90% by weight, and more preferably 70 to 99% by weight. By setting to such a range, the effect based on the polymerizable compound in the present invention is easy to be expressed. Two or more polyfunctional monomers may be comprised.

((Meth)acrylate Having a Phosphoester Group)

The polymerizable composition comprise preferably a (meth)acrylate having a phosphoester group, more preferably a compound represented by the formula (P). The inclusion of the (meth)acrylate compound having a phosphorester group improves the adhesion to the inorganic layer.

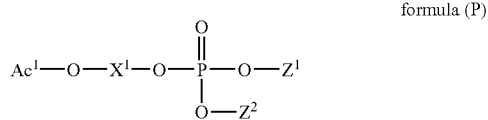

formula (P)

wherein $Z^1$ represents $Ac^2$—O—$X^2$—, a substituent group not having a polymerizable group, or a hydrogen atom, $Z^2$ represents $A^3$—O—$X^3$—, a substituent group not having a polymerizable group, or a hydrogen atom, $Ac^1$, $Ac^2$ and $Ac^3$ each represent an acryloyl group or a methacryloyl group, and $X^1$, $X^2$ and $X^3$ each an alkylene group, an alkyleneoxy group, an alkyleneoxycarbonyl group, or an alkylenecarbonyloxy group, or a combination thereof.

The compound represented by the formula (P) is preferably a monofunctional monomer represented by the formula (P-1), a bifunctional monomer represented by the formula (P-2) and a trifunctional monomer represented by the formula (P-3).

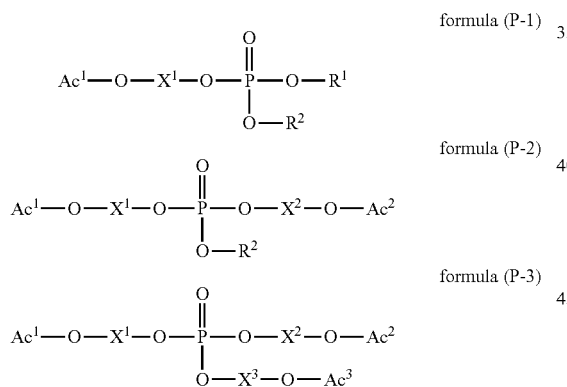

formula (P-1)

formula (P-2)

formula (P-3)

The definitions of $Ac^1$, $Ac^2$, $Ac^3$, $X^1$, $X^2$ and $X^3$ are the same as those in the formula (P). In the formula (P-1) and formula (P-2), $R^1$ represents a substituent not having a polymerizable group, or a hydrogen atom, and $R^2$ represents a substituent group not having a polymerizable group, or a hydrogen atom.

In the formula (P), (P-1) to (P-3), the carbon numbers of $X^1$, $X^2$ and $X^3$ are preferably 1 to 12, more preferably 1 to 6, still more preferably 1 to 4. Examples of the alkylene group which $X^1$, $X^2$ and $X^3$ may have, and examples of the alkylnene portion of the alkyleneoxy group, the alkyleneoxycarbonyl group and the alkylenecarbonyloxy group which $X^1$, $X^2$ and $X^3$ may have include a methylene group, an ethylene group, a propylene group, a butylene group, a pentylene group, and a hexylene group. The alkylene group may be a linear or branched alkylene group, preferably a linear alkylene group. $X^1$, $X^2$ and $X^3$ are preferably an alkylene group.

In the formula (P), (P-1) to (P-3), examples of the substituent group not having a polymerizable group include an alkyl group, an alkoxy group, an aryl group and an aryloxy group, and a combination thereof. Preferred is an alkyl group and an alkoxy group, and more preferred is an alkoxy group.

The carbon number of the alkyl group is preferably 1 to 12, more preferably 1 to 9, still more preferably 1 to 6. Examples of the alkyl group include a methyl group, an ethyl group, a propyl group, a butyl group, a pentyl group and a hexyl group. The alkyl group may be a linear, branched, or cyclic group, and preferably a linear alkyl group. The alkyl group may be substituted with an alkoxy group, an aryl group, an aryloxy group, and the like.

The carbon number of the aryl group is preferably 6 to 14, more preferably 6 to 10. Examples of the aryl group include a phenyl group, a 1-naphthyl group, and a 2-naphtyl group. The aryl group may be substituted with an alkyl group, an alkoxy group, an aryloxy group, and the like.

As the alkyl portion of the alkoxy group and the aryl portion of the aryloxy group, the above explanation for the alkyl group and the aryl group may be referred to.

In the present invention, the monomer represented by the formula (P) may be used singly or as combined. When the compounds are used as combined, may be used a combination comprising two or more kinds of a monofunctional compound represented by the formula (P-1), a bifunctional compound represented by the formula (P-2) and a trifunctional compound represented by the formula (P-3).

In the present invention, as the above polymerizable monomers having a phosphate group, may be used commercially available compounds such as KAYAMER series manufactured by NIPPON KAYAKU CO., LTD, and Phosmer series manufactured by Uni chemical, and a compound newly synthesized.

Specific examples of the (meth)acrylate having a phosphate group, which is preferably used in the present invention, mentioned below, to which, however, the present invention should not be limited.

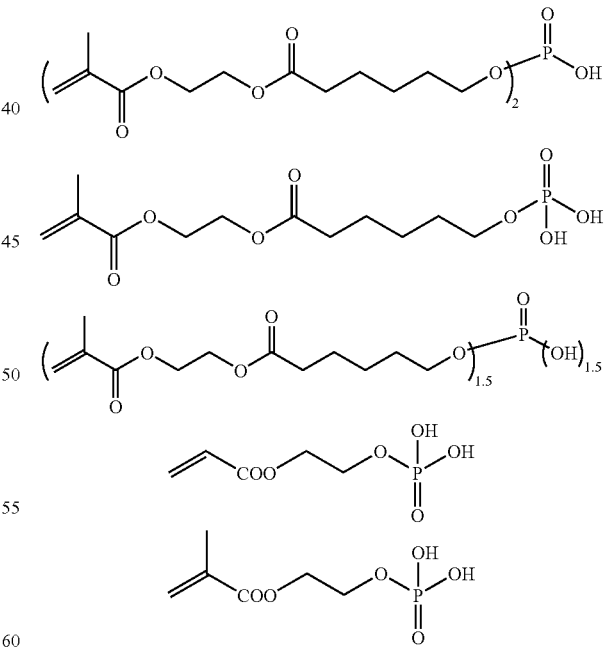

The amount of the (meth) acrylate having a phosphate group in the polymerizable composition is preferably 0.01 to 50% by weight, more preferably 0.1 to 30% by weight.

The largest amount of the (meth)acrylate having a phosphate group and the polymerizable compound having a bisphenol skeleton and having an aliphatic group of the polymerizable composition is preferably not more than 50% by weight, more preferably not more than 30% by weight.

By setting such a range, even when the curing condition is not enough, failure(bleed out) caused by bleeding owing to heat transfer of the uncuring is prevented from occurring.
(Polymerization Initiator)

The polymerizable composition in the present invention may include a polymerization initiator. In the case where a photopolymerization initiator is used, its amount is preferably at least 0.1 mol % of the total amount of the polymerizing compound, more preferably from 0.5 to 2 mol %. By setting the thus-designed composition, polymerization reaction though an active ingredient forming reaction may be suitably controlled. Examples of the photopolymerization initiator include Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Lamberti's commercial products, Ezacure series (e.g., Ezacure TZM, Ezacure TZT, Ezacure KTO46), etc.
(Method of Formation of Organic Layer)

The method for forming the organic layer is not specifically defined. For example, the layer may be formed according to a solution coating method or a vacuum film formation method. The solution coating method is, for example, a dipping method, an air knife coating method, a curtain coating method, a roller coating method, a wire bar coating method, a gravure coating method, a slide coating method, or an extrusion coating method using a hopper as in U.S. Pat. No. 2681294. The vacuum film formation method is not specifically defined, but is preferably a film formation method by vapor deposition or plasma CVD. In the present invention, the polymer may be applied for coating as its solution, or a hybrid coating method along with an inorganic material, as in JP-A 2000-323273 and 2004-25732, may also be used.

In the present invention, the composition comprising the polymerizable monomer is cured by irradiation. The light for irradiation is generally a UV ray from a high-pressure mercury lamp or low-pressure mercury lamp. The radiation energy is preferably at least 0.1 J/cm$^2$, more preferably at least 0.5 J/cm$^2$. (Meth)acrylate series compounds may suffer from interference in polymerization owing to oxygen in air, and therefore, in their polymerization, the oxygen concentration or the oxygen partial pressure is preferably lowered. In the case where the oxygen concentration in polymerization is lowered according to a nitrogen purging method, the oxygen concentration is preferably not more than 2%, more preferably not more than 0.5%. In the case where the oxygen partial pressure in polymerization is lowered by a pressure reduction method, the whole pressure is preferably not more than 1000 Pa, more preferably not more than 100 Pa. Especially preferred is UV polymerization with at least 0.5 J/cm$^2$ energy radiation under a condition of reduced pressure of not more than 100 Pa.

The organic layer is preferably smooth and has high membrane strength. The mean roughness (Ra) of 10 μm$^2$ of the organic layer is preferably not more than 10 nm, more preferably not more than 2 nm. Preferably, the rate of polymerization of monomer is at least 85%, more preferably at least 88%, even more preferably at least 90%, still more preferably at least 92%. The rate of polymerization as referred to herein means the ratio of the reacted polymerizable group to all the polymerizing group (acryloyl group and methacryloyl group) in the monomer mixture. The rate of polymerization may be quantitatively determined according to IR absorptiometry.

The thickness of the organic layer is not specifically defined. However, when the layer is too thin, then its thickness could hardly keep uniformity; but when too thick, the layer may be cracked by external force applied thereto and its barrier property may lower. From these viewpoints, the thickness of the organic layer is preferably from 50 nm to 2000 nm, more preferably from 200 nm to 1500 nm.

As so mentioned in the above, the organic layer is preferably smooth. The mean roughness (Ra) is preferably not more than 2 nm, more preferably not more than 1 nm. The surface of the organic layer is required not to have impurities and projections such as particles. Accordingly, it is desirable that the organic layer is formed in a clean room. The degree of cleanness is preferably not more than class 10000, more preferably not more than class 1000.

Preferably, the hardness of the organic layer is higher. It is known that, when the hardness of the organic layer is high, then the inorganic layer may be formed smoothly and, as a result, the barrier level of the gas barrier film is thereby improved. The hardness of the organic layer may be expressed as a microhardness based on a nano-indentation method. The microhardness of the organic layer is preferably at least 100 N/mm, more preferably at least 150 N/mm.

Two or more organic layers are preferably laminated. In this case, each layer may have the same composition or may have different compositions. In the case where two or more organic layers are laminated, they are preferably so designed that each organic layer could fall within the above-mentioned preferred range. As so mentioned in the above, the organic layer may be included as a layer have a composition continuously changing in the direction of the layer thickness with no definite interface between an organic layer and an inorganic layer, as illustrated in USP-A 2004-46497.
(Inorganic Layer)

The inorganic layer is, in general, a layer of a thin film formed of a metal compound. For forming the inorganic layer, employable is any method capable of producing the intended thin film. For it, for example, suitable are physical vapor deposition methods (PVD) such as vapor evaporation method, sputtering method, ion plating method; various chemical vapor deposition methods (CVD); liquid phase growth methods such as plating or sol-gel method. Of those, preferred are physical vapor deposition methods (PVD) and chemical vapor deposition methods (CVD), which may evade thermal influences on the substrate film in inorganic layer formation, and which may readily produce uniform thin film layers at rapid production speed. Not specifically defined, the component to be in the inorganic layer may be any one satisfies the above-mentioned requirements. For example, it includes metal oxides, metal nitrides, a metal carbide, a metal oxide-nitride, or a metal oxide-carbide. Preferably used are oxides, nitrides, carbide oxide-nitrides, or oxide-carbides comprising at least one metal selected from Si, Al, In, Sn, Zn, Ti, Cu, Ce and Ta. Of those, preferred are oxides, nitrides carbide oxide-nitrides, or oxide-carbides of a metal selected from Si, Al, In, Sn, Zn and Ti; more preferred are metal oxides, nitrides or oxide-nitrides with Si or Al. These may contain any other element as a subsidiary component.

Preferably, the surface smoothness of the inorganic layer formed in the present invention is less than 2 nm in terms of the mean roughness (Ra value) in 10 μm square, more preferably not more than 1 nm. Accordingly, it is desirable that the inorganic layer is formed in a clean room. Preferably, the degree of cleanness is not more than class 10000, more preferably not more than class 1000.

Not specifically defined, the thickness of the inorganic layer is generally within a range of from 5 to 500 nm/layer, preferably from 20 to 200 nm/layer. Two or more inorganic layers may be laminated. In the present invention, the embodiment in which two or more inorganic layers are provided improves the adhesion between the layers and may reduce the failure rate when it is used in an electric device. When not more than two layers are provided, the individual layers may have the same composition or different compositions. In case where two or more layers are laminated, it is desirable that the individual inorganic layers are so designed as to fall within the above-mentioned preferred ranges. In addition, as so mentioned hereinabove and as disclosed in JP Laid-Open 2004-46497, the inorganic layers may be gradation layers of which the composition changes continuously in the thickness direction of the layer, with no definite boundary to the adjacent inorganic layer.

(Lamination of Organic Layer and Inorganic Layer)

The organic layer and the inorganic layer may be laminated by repeated film formation to form the organic layer and the inorganic layer in a desired layer constitution. In case where the inorganic layer is formed according to a vacuum film formation method such as sputtering method, vacuum evaporation method, ion plating method or plasma CVD method, then it is desirable that the organic layer is also formed according to a vacuum film formation method such as the above-mentioned flash vapor deposition method. While the barrier layer is formed, it is especially desirable that the organic layer and the inorganic layer are laminated all the time in a vacuum of not more than 1000 Pa, not restoring the pressure to an atmospheric pressure during the film formation. More preferably, the pressure is not more than 100 Pa, even more preferably not more than 50 Pa, still more preferably not more than 20 Pa.

(Functional Layer)

The device of the present invention may have a functional layer on the barrier laminate or in any other position. The functional layer is described in detail in JP-A 2006-289627, paragr 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an adhesive layer, etc.

(Use of Barrier Laminate)

In general, the barrier laminate of the present invention is formed on a support. Selecting the support, the barrier laminate may have various applications. The support includes a substrate film, as well as various devices, optical members, etc. Concretely, the barrier laminate of the present invention may be used as a barrier layer of a barrier film substrate. The barrier laminate and the barrier film substrate of the present invention may be used for sealing up devices that require gas-barrier performance. The barrier laminate and the barrier film substrate of the present invention may apply optical members. These are described in detail hereinunder.

<Barrier Film Substrate>

The barrier film substrate comprises a substrate film and a barrier laminate formed on the substrate film. In the barrier film substrate, the barrier laminate of the present invention may be provided only one surface of the substrate film, or may be provided on both surfaces thereof. The barrier laminate of the present invention may be laminated in an order of an inorganic layer and an organic layer from the side of the substrate film; or may be laminated in an order of an organic layer and an inorganic layer from it. The uppermost layer of the laminate of the present invention may be an inorganic layer or an organic layer.

The barrier film substrate of the present invention is a film substrate having a barrier layer that functions to block oxygen, water, nitrogen oxide, sulfur oxide, ozone and others in air.

Not specifically defined, the number of the layers that constitute the barrier film substrate may be typically from 2 layers to 30 layers, more preferably from 3 layers to 20 layers.

The barrier film substrate may have any other constitutive components (e.g., functional layers such as adhesive layer) in addition to the barrier laminate and the substrate film. The functional layer may be disposed on the barrier laminate, or between the barrier laminate and the substrate film, or on the side (back) of the substrate film not coated with the barrier laminate.

(Plastic Film)

In the barrier film substrate of the present invention, the substrate film is generally a plastic film. Not specifically defined in point of the material and the thickness thereof, the plastic film usable herein may be any one capable of supporting a laminate of an organic layer and an inorganic layer; and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the barrier film substrate of the present invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of not less than 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (Mitsubishi gas chemical company's Neopulim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

In the case where the gas barrier film of the present invention is used in combination with a polarizing plate, it is preferable that the gas barrier layer surface of the gas barrier film is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the present invention is utilized as a device such as organic EL devices, the plastic film must be transparent, namely its light transmittance is usually not less than 80%, preferably not less than 85%, and more preferably not less than 90%. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the present invention is used for display use, for example, when it is not disposed on the side of an observer, the transparency is not always required. Accordingly, in such case, an opaque material can also be used as the plastic film. Examples of the opaque material include a known liquid crystal polymer such as polyimides and polyacrylonitrile.

The thickness of the plastic film to be used for the gas barrier film of the present invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a passivation layer, an antistatic layer, a smoothening layer, an adhesion improving layer, a light shielding layer, an antireflection layer, a hard coat layer, a stress relaxing layer, an antifogging layer, an antifouling layer, a layer to be printed and an easily adhesive layer.

<Device>

The barrier laminate and the barrier film substrate of the present invention are favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, other electronic devices. More preferred are organic EL devices.

The barrier laminate of the present invention may be used for film-sealing of devices. Specifically, this is a method of providing a barrier laminate of the present invention on the surface of a device serving as a support by itself. Before providing the barrier laminate, the device may be covered with a protective layer.

The barrier film substrate of the present invention may be used as a substrate of a device or as a film for sealing up according to a solid sealing method. The solid sealing method comprises forming a protective layer on a device, then forming an adhesive layer and a barrier film substrate as laminated thereon, and curing it. Not specifically defined, the adhesive may be a thermosetting epoxy resin, a photocurable acrylate resin, etc.

(Organic EL Device)

Examples of an organic EL device with a barrier film substrate are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the barrier film substrate of the present invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the substrate of the present invention may be sued as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensatory bent) type, a CPA (continuous pinwheel alignment) type, or an IPS (in-plane switching) type. (Others) Other applications of the present invention are thin-film transistors as in JP-T 10-512104, touch panels as in JP-A 5-127822, 2002-48913, electronic papers as in JP-A 2000-98326, and solar cells as in Japanese Patent Application No. 7-160334.

<Optical Member>

An example of the optical member that comprises the barrier laminate of the present invention is a circular polarizer.

(Circular Polarizer)

Laminating a barrier film substrate of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the present invention are described more concretely with reference to the following Examples. In the following Examples, the material used, its amount and the ratio, the details of the treatment and the treatment process may be suitably modified or changed not overstepping the sprit and the scope of the present invention. Accordingly, the present invention should not be limitatively interpreted by the Examples mentioned below.

In the present Examples, the following compounds were used.

A-1:

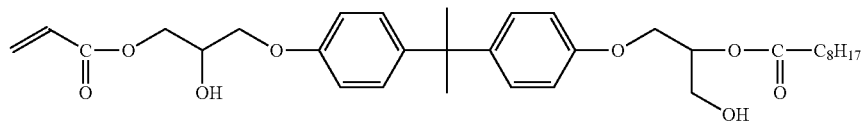

A-2:
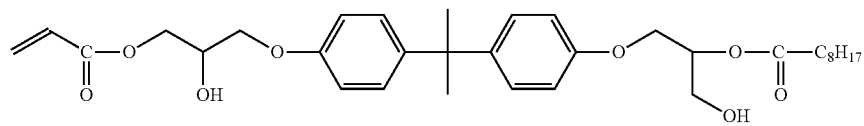
A-3:
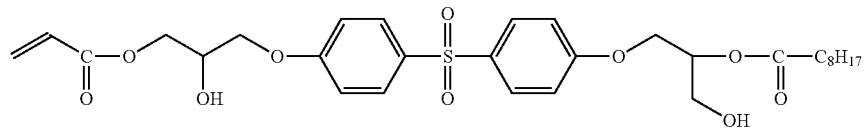
A-4:
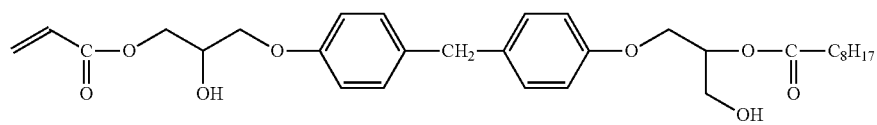
A-5:
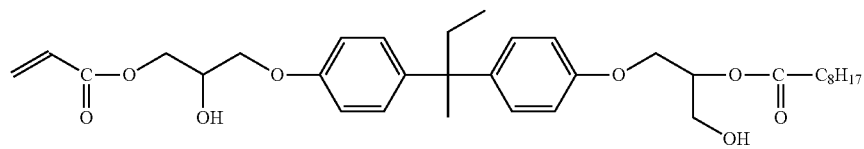
A-6:
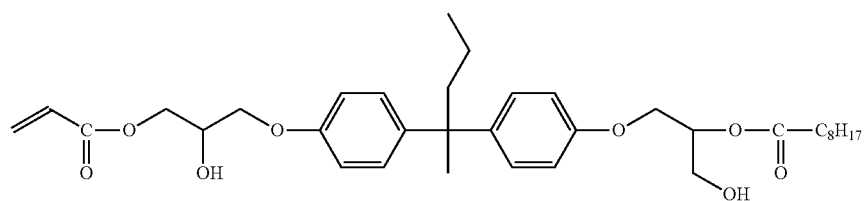
A-7:
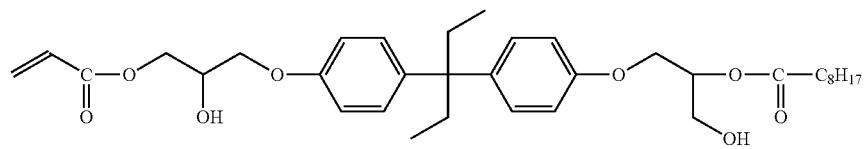
A-8:
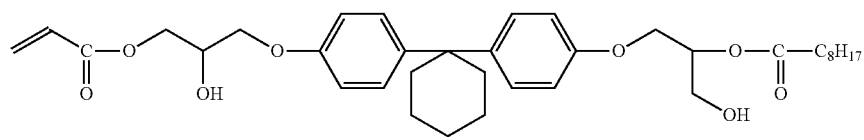
B-1: Bisphenol A epoxyacrylate (manufactured by Shin-Nakamura Chemical Co., LTD, NK origo (Trademark) EA-1020)
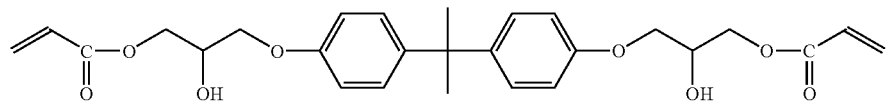
B-2:
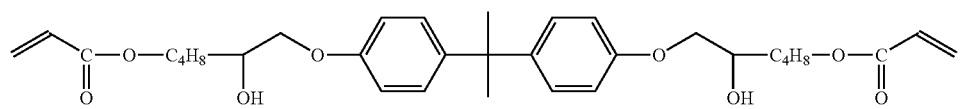

-continued
B-3:
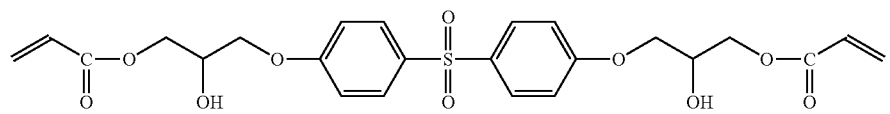
B-4:
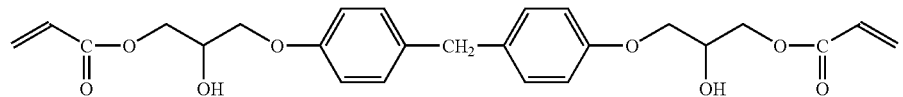
B-5:
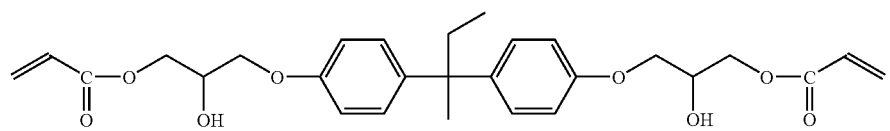
B-6:
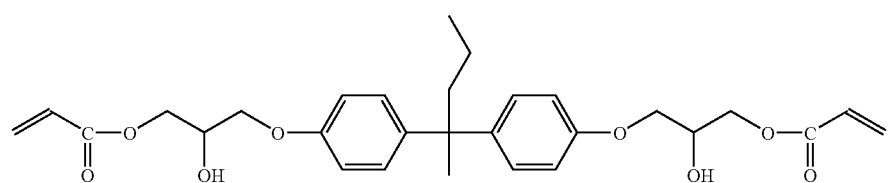
B-7:
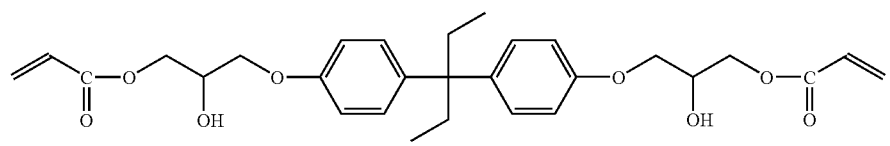
B-8:
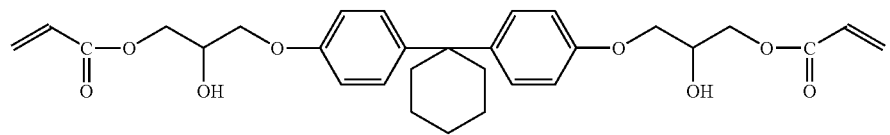
B-9:
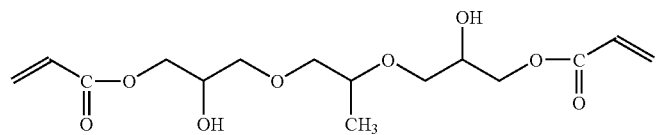
B-10:
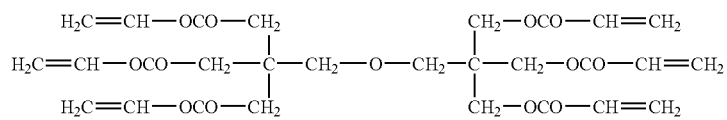

C-1: Polymerization Initiator (Chiba Speciality Chemicals, IRGACURE907)

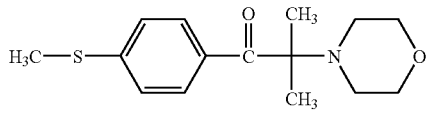

C-2: Polymerization Initiator (Lamberti, Ezacure KTO46)

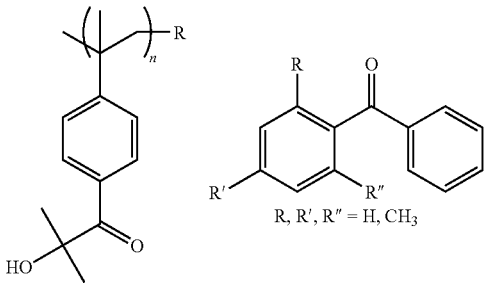

R, R', R'' = H, CH$_3$

D-1:

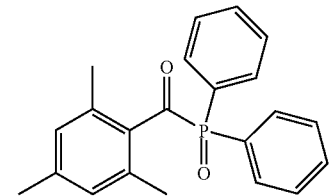

D-2:

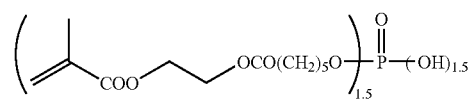

E-1: Bisphenot A type EO modified diacrylate (Toagosei Ltd., M-210)

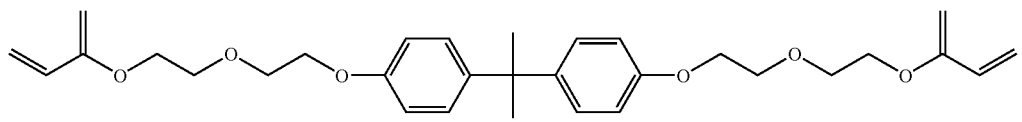

Formation of Barrier Film Laminate (1)

On a substrate (manufactured by TORAY, Lumirror T60, having a thickness of 100 μm), a composition comprising a polymerizable monomer shown in the following Table (the total amount is 20 weight parts) and the polymerization initiator (Chiba Speciality Chemicals, IRGACURE907) was prepared using methyl ethyl ketone to form a film having a dry film thickness of 500 nm, and then cured through irradiation with UV rays at a dose of 0.5 J/cm$^2$ in atmosphere having 100 ppm of oxygen, thereby producing the organic layer. Aluminum oxide was deposited on the surface of the formed organic layer according to a sputtering method to form a film having thickness of 50 nm, thereby producing a barrier film substrate. The obtained barrier film substrate was tested and evaluated for the water vapor permeability according to the test methods mentioned below.

[Water Vapor Permeability (g/m$^2$/day)]:

Determined with "PERMATRAN-W3/31" manufactured by MOCON (40° C., 90% RH). The results were shown in the following table. Water vapor permeability of less than 0.01 g/m$^2$·day, which is detection limit in the method, was shown as <0.01.

TABLE 1

| | Polymerizable monomer | | Water Vapor Permeability (g/m$^2$ · day) |
|---|---|---|---|
| | Kind | Amount (Weight parts) | |
| Example 1 | A-1/B-1 | 5/15 | <0.01 |
| Example 2 | A-1/B-1 | 10/10 | <0.01 |
| Example 3 | A-1/B-1 | 0.3/19.7 | <0.01 |
| Example 4 | A-1/B-1/D-1 | 5/14/1 | <0.01 |
| Example 5 | A-2/B-2/D-1 | 5/14/1 | <0.01 |
| Example 6 | A-3/B-3 | 5/15 | <0.01 |
| Example 7 | A-4/B-4 | 5/15 | <0.01 |
| Example 8 | A-5/B-5 | 5/15 | <0.01 |
| Example 9 | A-6/B-6 | 5/15 | <0.01 |
| Example 10 | A-7/B-7 | 5/15 | <0.01 |
| Example 11 | A-8/B-8 | 5/15 | <0.01 |
| Example 12 | A-1/B-9 | 5/14 | <0.01 |
| Comparative Example 1 | B-1 | 20 | 0.01 |
| Comparative Example 2 | A-1/B-1 | 0.1/19.9 | 0.01 |
| Comparative Example 3 | A-1/B-1 | 15/5 | 0.1 |
| Comparative Example 4 | B-9 | 20 | 0.04 |

As is clear from the above table, the barrier film substrates of the present invention were excellent in water vapor permeability, which is less than 0.01 g/m$^2$·day. The barrier film substrates of the present invention were smooth for the surface of the organic layer thereof. However, in Comparative Example 3, the surface of the organic layer was sticky after the curing, and the inorganic layer was not formed in uniformly.

Film formations were carried out according to the same methods as the above Example 1 and Comparative Example 1, to which, however, the organic layers each were formed by a flash vapor deposition method. The results were similar to those.

For the samples of Example 1, Example 12, Comparative Example 1, and Comparative Example 4, the water vapor permeability lower than the detection limit in the MOCON method was analyzed according to the method described in G. NISATO, P. C. P. BOUTEN, P. J. SLIKKERVEER, et al.; SID Conference Record of the International Display Research Conference 1435-1438. The measures were carried out at 40° C. and 90% RH. The results were shown in below table.

TABLE 2

|  | Water Vapor Permeability (g/m² · day) |
|---|---|
| Example 1 | 0.0012 |
| Example 12 | 0.0055 |
| Comparative Example 1 | 0.0098 |
| Comparative Example 4 | 0.0322 |

As is clear from the above table, the barrier film substrates of the present invention have much higher barrier property. The present invention is particularly advantageous because the improvement of barrier property in the level of not more than 0.01 g/m²/day is required recently.

Formation of Barrier Film Substrate (2)

On a substrate (manufactured by Teihin DuPont, Teonex Q65FA, having a thickness of 100 μm), a composition comprising a polymerizable monomer shown in the following Table (the total amount is 20 weight parts) and the polymerization initiator (Chiba Speciality Chemicals, IRGACURE907) was prepared using methyl ethyl ketone to form a film having a dry film thickness of 1000 nm, and then cured through irradiation with UV rays at a dose of 1.2 J/cm² in atmosphere having 100 ppm of oxygen, thereby producing the organic layer. Aluminum oxide was deposited on the surface of the formed organic layer according to a sputtering method to form a film having thickness of 60 nm, thereby producing a barrier film substrate. The obtained barrier film was tested and evaluated for the water vapor permeability according to the test methods mentioned below.

[Water Vapor Permeability (g/m²/day)]:

The water vapor permeability were measured according to the method described in G. NISATO, P. C. P. BOUTEN, P. J. SLIKKERVEER, et al.; SID Conference Record of the International Display Research Conference 1435-1438. The measure was carried out at 40° C. and 90% RH. The results were shown in below table.

TABLE 3

|  | Polymerizable monomer | | Water Vapor Permeability (g/m² · day) |
|---|---|---|---|
|  | Kind | Amount (Weight parts) |  |
| Example 101 | A-1/B-1/D-2 | 5/14/1 | 0.0012 |
| Example 102 | A-1/B-10/D-2 | 5/14/1 | 0.0026 |
| Comparative Example 101 | A-1/D-2 | 19/1 | 0.041 |
| Comparative Example 102 | B-10/D-2 | 19/1 | 0.032 |

Formation of Barrier Film Substrate (3)

The barrier film substrates having the following constitution were formed according to a similar manner to the above formation of barrier film substrate (1). Herein, organic layer (Example 1) means that it has the same constitution as the organic layer of the above Example 1. The other organic layers are shown accordingly.

Example 21 (alternate layer) (Example) Substrate/organic layer (Example 1)/inorganic layer ($Al_2O_3$)/organic layer (Example 1)/inorganic layer ($Al_2O_3$)

Example 31 (alternate layer) (Example) Substrate/organic layer (Example 4)/inorganic layer ($Al_2O_3$)/organic layer (Example 4)/inorganic layer ($Al_2O_3$)

Comparative Example 21 (alternate layer) Substrate/organic layer (Comparative Example 1)/inorganic layer ($Al_2O_3$)/organic layer (Comparative Example 1)/inorganic layer ($Al_2O_3$)

Example 22 (alternate layer in first surface and alternate layer in second surface) (Example) Inorganic layer ($Al_2O_3$)/organic layer (Example 1)/inorganic layer ($Al_2O_3$)/organic layer (Example 1)/substrate/organic layer (Example 1)/inorganic layer ($Al_2O_3$)/organic layer (Example 1)/inorganic layer ($Al_2O_3$)

Example 32 (alternate layer in first surface and alternate layer in second surface) (Example) Inorganic layer ($Al_2O_3$)/organic layer (Example 4)/inorganic layer ($Al_2O_3$)/organic layer (Example 4)/substrate/organic layer (Example 4)/inorganic layer ($Al_2O_3$)/organic layer (Example 4)/inorganic layer ($Al_2O_3$)

Comparative Example 22 (alternate layer in first surface and alternate layer in second surface) Inorganic layer ($Al_2O_3$)/organic layer (Comparative Example 1)/inorganic layer ($Al_2O_3$)/organic layer (Comparative Example 1)/substrate/organic layer (Comparative Example 1)/inorganic layer ($Al_2O_3$)/organic layer (Comparative Example 1)/inorganic layer ($Al_2O_3$)

Example 23 (alternate layer in first surface and alternate layer in second surface) (Example) Inorganic layer ($Al_2O_3$)/organic layer (Example 1)/inorganic layer ($Al_2O_3$)/organic layer (Example 1)/inorganic layer ($Al_2O_3$)/organic layer (Example 1)/substrate/organic layer (Example 1)/inorganic layer ($Al_2O_3$)/organic layer (Example 1)/inorganic layer ($Al_2O_3$)/organic layer (Example 1)/inorganic layer ($Al_2O_3$)

Example 33 (alternate layer in first surface and alternate layer in second surface) (Example) Inorganic layer ($Al_2O_3$)/organic layer (Example 4)/inorganic layer ($Al_2O_3$)/organic layer (Example 4) /inorganic layer ($Al_2O_3$)/organic layer (Example 4)/substrate/organic layer (Example 4)/inorganic layer ($Al_2O_3$)/organic layer (Example 4)/inorganic layer ($Al_2O_3$)/organic layer (Example 4)/inorganic layer ($Al_2O_3$)

Comparative Example 23 (alternate layer in first surface and alternate layer in second surface) Inorganic layer ($Al_2O_3$)/organic layer (Comparative Example 1)/inorganic layer (Al2O3)/organic layer (Comparative Example 1)/inorganic layer ($Al_2O_3$)/organic layer (Comparative Example 1)/substrate/organic layer (Comparative Example 1)/inorganic layer ($Al_2O_3$)/organic layer (Comparative Example 1)/inorganic layer ($Al_2O_3$)/organic layer (Comparative Example 1)/inorganic layer ($Al_2O_3$)/organic layer (Comparative Example 1)/inorganic layer ($Al_2O_3$)

[Test for Adhesion]

In order to evaluate the adhesion of the barrier film substrate, cross-cut adhesion test compliant to JIS K5400 was carried out. The surface of the barrier film substrates having the above construction was cut in at the entering angle of 90 degree toward the film surface at 1 mm interval, thereby producing one hundred of cross-cut at 1 mm interval. On the surface thereof, Mylar tape having the wide of 2 cm (manufactured by Nitto Denko, polyester tape, No. 31B) was attached, and then was peeled off using a tape peeling testing machine. The number (n) of the remaining grids which didn't peel off from one hundred of cross-cut on the laminated film was counted.

[Evaluation in Organic EL Device]

In order to evaluate gas barrier property, an organic EL device in which vapor or oxygen causes dark spot was formed. An ITO film-having conductive glass substrate (surface resistivity, 10 Ω/square) was washed with 2-propanol, and then processed for UV ozone treatment for 10 minutes. On the substrate (anode), the following compound layers were formed in order by vapor deposition according to a vacuum vapor deposition method.

(First Hole Transporting Layer)

Copper phthalocyanine: film thickness 10 nm.

(Second Hole Transporting Layer)

N,N'-diphenyl-N,N'-dinaphthylbenzidine: film thickness 40 nm.

(Light-Emitting Layer Also Serving as Electron Transporting Layer)

Tris(8-hydroxyquinolinato)aluminium: film thickness 60 nm.

(Electron Injection Layer)

Lithium fluoride: film thickness 1 nm.

A metal aluminium was formed on it through vapor deposition to form a cathode having a thickness of 100 nm, and a silicon nitride film having a thickness of 3 μm was formed thereon according to a parallel plate CVD method, thereby constructing an organic EL device.

Next, using a thermosetting adhesive (Epotec 310, by Daizo-Nichimori), the barrier film substrates formed in the above formation of barrier film substrate (3) and the organic EL device were stuck together in such a manner that the side of the barrier film substrate laminated with barrier layer could be on the side of the organic EL device, and heated at 65° C. for 3 hours to cure the adhesive. 20 test pieces of every sample of the thus-sealed organic EL device were prepared.

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot.

Finally, the devices were stored in a dark room at 60° C. and 90% RH for 24 hours, and then tested for light emission. The proportion of the test pieces that gave dark spots larger than 300 ptm in diameter is defined as a failure rate. The failure rate of every sample was computed. The results are shown in the following below. In the table, "organic"means "organic layer" and "inorganic" means "inorganic layer".

TABLE 4

| | Layer constitution | Adhesion Remaining number (n/100) | Failure rate (%) |
|---|---|---|---|
| Example 21 | Substrate/organic/inorganic | 100 | 25 |
| Example 22 | inorganic/organic/inorganic/organic/Substrate/organic/inorganic/organic/inorganic | 17 | 15 |
| Example 23 | inorganic/organic/inorganic/organic/inorganic/organic/Substrate/organic/inorganic/organic/inorganic/organic/inorganic | 8 | 5 |
| Example 31 | Substrate/organic/inorganic | 100 | 25 |
| Example 32 | inorganic/organic/inorganic/organic/Substrate/organic/inorganic/organic/inorganic | 100 | 10 |
| Example 33 | inorganic/organic/inorganic/organic/inorganic/organic/Substrate/organic/inorganic/organic/inorganic/organic/inorganic | 98 | 0 |
| Comparative Example 21 | Substrate/organic/inorganic | 100 | 40 |
| Comparative Example 22 | inorganic/organic/inorganic/organic/Substrate/organic/inorganic/organic/inorganic | 21 | 20 |
| Comparative Example 23 | inorganic/organic/inorganic/organic/inorganic/organic/Substrate/organic/inorganic/organic/inorganic/organic/inorganic | 6 | 20 |

Further, the organic EL devices having the barrier film substrate of Example 23, Example 33 and Comparative Example 23 were continuously lighted at 500 cd/m² requested for TV, and then the luminance thereof was measured. To become 300 cd/square, Example 23 took for 2100 hours, Example 33 took for 2100 hours, and Comparative Example 23 took for 1500.

Formation of Barrier Film Laminate (4)

Similarly to the formation of barrier film laminate (2), on a substrate (manufactured by Teijin DuPont, Teonex Q65FA, having a thickness of 100 μm), a composition comprising a polymerizable monomer shown in the Table 5 (the total amount is 20 weight parts) and the polymerization initiator (Lamberti, Ezacure KTO46) was prepared using methyl ethyl ketone to form a film having a dry film thickness of 600 nm, and then cured through irradiation with UV rays at a dose of 1.2 J/cm² in atmosphere having 100 ppm of oxygen, thereby producing the organic layer. Aluminum oxide was deposited on the surface of the formed organic layer according to a sputtering method to form a film having thickness of 50 nm, thereby producing a barrier film substrate. The obtained barrier film substrate was tested and evaluated for the water vapor permeability according to the same method as the Example 101. Using the barrier film substrate, organic EL devices were formed. All of the organic EL devices using the barrier film substrate of the present invention properly lighted up.

TABLE 5

| | Polymerizable monomer | | Water Vapor Permeability (g/m² · day) |
|---|---|---|---|
| | Kind | Amount (Weight parts) | |
| Example 201 | A-1/B-1/E-1/D-2 | 5/6/8/1 | 0.0012 |
| Example 202 | A-1/B-1/D-2 | 5/14/1 | 0.0012 |
| Example 203 | A-1/E-1/D-2 | 5/14/1 | 0.0017 |

The present disclosure relates to the subject matter contained in Japanese Patent Application No. 104517/2008 filed on Apr. 14, 2008 and Japanese Patent Application No. 056794/2009 filed on Mar. 10, 2009, which are expressly incorporated herein by reference in their entirety. All the publications referred to in the present specification are also expressly incorporated herein by reference in their entirety.

The foregoing description of preferred embodiments of the present invention has been presented for purposes of illustration and description, and is not intended to be exhaustive or to limit the present invention to the precise form disclosed. The description was selected to best explain the principles of the present invention and their practical application to enable others skilled in the art to best utilize the present invention in various embodiments and various modifications as are suited to the particular use contemplated. It is intended that the scope of the present invention not be limited by the specification, but be defined claims set forth below.

What is claimed is:

1. A barrier laminate comprising at least one organic layer and at least one inorganic layer,
    wherein the organic layer is obtained by curing a polymerizable composition, and
    wherein the polymerizable composition comprises 1 to 50% by weight of a compound represented by the following formula (A):

formula (A)

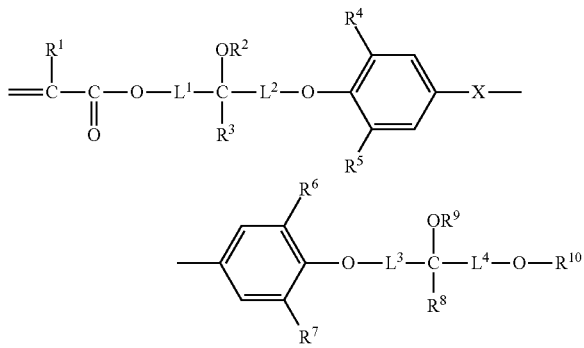

wherein X is an alkylene group, $L^1$, $L^2$, $L^3$ and $L^4$ each independently represent a linear or branched alkylene group, $R^1$, $R^2$, $R^3$, $R^4$, $R^5$, $R^6$, $R^7$, $R^8$ and $R^9$ each independently represent a hydrogen atom, or a substituted or unsubstituted alkyl group, and $R^{10}$ is a linear or branched alkyl group; and
    50-99% by weight of a polyfunctional monomer represented by the following formula (B):

formula (B)

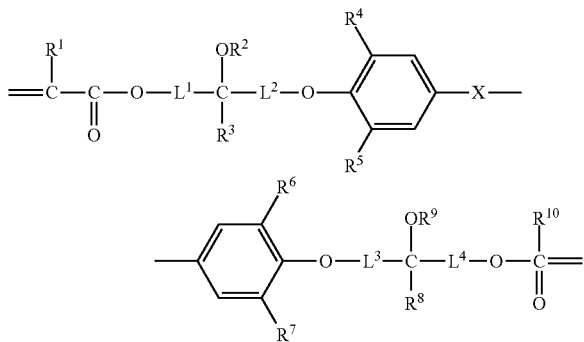

wherein X is an alkylene group, $L^1$, $L^2$, $L^3$ and $L^4$ each independently represent a linear or branched alkylene group, $R^1$, $R^2$, $R^3$, $R^4$, $R^5$, $R^6$, $R^7$, $R^8$, $R^9$ and $R^{10}$ each independently represent a hydrogen atom, or a substituted or unsubstituted alkyl group.

2. The barrier laminate according to claim 1, which further comprises at least one (meth) acrylate monomer having a phosphoester group.

3. The barrier laminate according to claim 1, wherein the polymerizable composition further comprises at least one compound represented by the following formula (P):

formula (P)

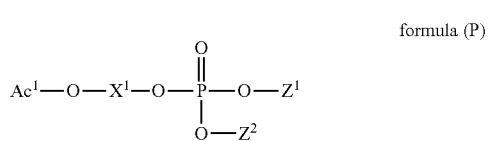

wherein $Z^1$ represents $Ac^2$—O—$X^2$—, an substituent group not having a polymerizable group, or a hydrogen atom, $Z^2$ represents $Ac^3$—O—$X^3$—, an substituent group not having a polymerizable group, or a hydrogen atom, $Ac^1$, $Ac^2$ and $Ac^3$ each independently represent an acryloyl group or a methacryloyl group, and $X^1$, $X^2$ and $X^3$ each independently represent an alkylene group, an alkyleneoxy group, an alkyleneoxycarbonyl group, or an alkylenecarbonyloxy group, or a combination thereof.

4. The barrier laminate according to claim 1, which has an alternate layer structure of the organic layer and the inorganic layer.

5. The barrier laminate according to claim 1, which has an alternate layer structure of the organic layer and the inorganic layer, and comprises at least two of the inorganic layers.

6. The barrier laminate according to claim 1, wherein the inorganic layer comprises a metal oxide, a metal carbide, a metal oxide-nitride, or a metal oxide-carbide.

7. A barrier film substrate produced by providing the barrier laminate according to claim 1 on a substrate film.

8. A device which comprises the barrier laminate according to claim 1.

9. The device according to claim 8, wherein the barrier laminate is provided on a substrate film so as to produce a barrier film substrate, and the barrier film substrate is used as a substrate.

10. The device according to claim 8, wherein the barrier laminate is provided on a substrate film so as to produce a barrier film substrate, and the barrier film substrate is used to seal the device.

11. The device according to claim 8, wherein the barrier laminate is used to seal the device.

12. The device according to claim 8, in which said device is an organic electroluminescent device.

* * * * *